(12) United States Patent
Leigh et al.

(10) Patent No.: US 7,780,455 B2
(45) Date of Patent: Aug. 24, 2010

(54) SYSTEM HAVING PRIMARY AND SECONDARY BACKPLANES

(75) Inventors: Kevin B. Leigh, Houston, TX (US); David W. Sherrod, Tomball, TX (US); Kurt A. Manweiler, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 127 days.

(21) Appl. No.: 11/669,860

(22) Filed: Jan. 31, 2007

(65) Prior Publication Data

US 2008/0180929 A1 Jul. 31, 2008

(51) Int. Cl.
H01R 12/00 (2006.01)
(52) U.S. Cl. .......................................................... 439/61
(58) Field of Classification Search .................... 439/61, 439/62; 361/788, 777, 785
See application file for complete search history.

(56) References Cited

U.S. PATENT DOCUMENTS

| | | | | |
|---|---|---|---|---|
| 4,179,172 A | * | 12/1979 | Godsey et al. ................ 439/61 |
| 5,598,318 A | * | 1/1997 | Dewitt et al. ................ 361/683 |
| 6,202,110 B1 | * | 3/2001 | Coteus et al. ............... 710/301 |
| 6,392,142 B1 | * | 5/2002 | Uzuka et al. ................ 174/541 |
| 6,431,890 B1 | * | 8/2002 | Li et al. ....................... 439/160 |
| 6,757,177 B2 | * | 6/2004 | Harris et al. ................ 361/788 |
| 6,866,544 B1 | * | 3/2005 | Casey et al. ................. 439/607 |

* cited by examiner

*Primary Examiner*—T C Patel
*Assistant Examiner*—Phuong Nguyen

(57) ABSTRACT

A system comprises a primary backplane and a secondary backplane. The primary backplane has a surface region substantially devoid of components and a plurality of connectors to which electronic devices can be mated. The secondary backplane is removably mated to the primary backplane within the region. The secondary backplane has at least two connectors adapted to mate to at least two of the electronic devices. At least two electronic devices communicatively interconnect through the primary and secondary backplanes.

21 Claims, 3 Drawing Sheets

SYSTEM HAVING PRIMARY AND SECONDARY BACKPLANES

BACKGROUND

Many electronic systems comprise a backplane to which one or more electronic devices (e.g., circuit boards, blade devices, etc.) mate. The backplane typically is a circuit board comprising conductive traces that interconnect various electrical connectors mounted on the board. An electrical device includes an electrical connector that mates to a corresponding backplane connector when the electrical device is installed in the system.

While a backplane generally is a suitable mechanism for interconnecting the various devices in the system, for some systems the vast number of electrical interconnections between the various components provided on the installed devices can make the backplane exceedingly complex and uneconomical to produce.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ."

The term "communicatively interconnected" includes electrical and optical connectivity. For example, two or more electrical devices may electrically or optically connect to a backplane circuit board and, through the backplane, communicatively interconnect with each other.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
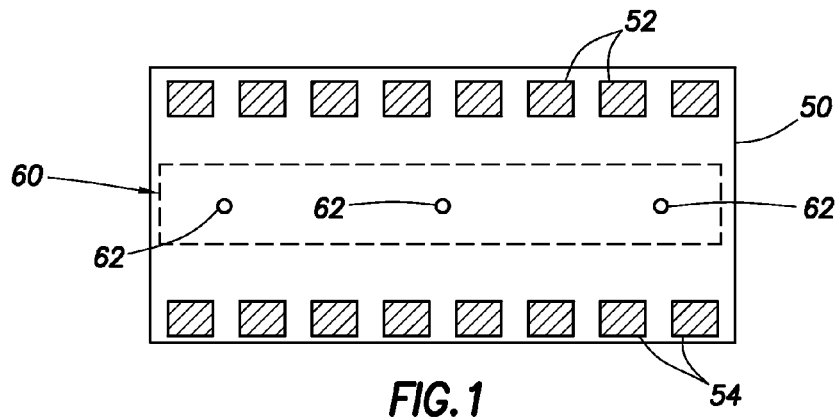
FIG. 1 shows a first surface of a primary backplane in accordance with various embodiments.

FIG. 1 illustrates a first surface of a "primary" backplane 50 that is adapted to be installed in a system. The term "primary" does not impart any functional limitations on the backplane 50 and is simply used as an adjective to distinguish backplane 50 from another backplane (a "secondary" backplane) that will be discussed below. The primary backplane 50, in some embodiments, is installed in a chassis of the system and permits various electrical devices also installed in the chassis to be electrically and/or optically coupled together. The electrical devices install into slots in the chassis. Examples of such electrical devices comprise server blades, input/output (I/O) blades, switch blades, storage blades, memory blades, circuit cards, etc.

An embodiment of the primary backplane 50 shown in FIG. 1 comprises a printed circuit board (PCB) having two rows of connectors 52 and 54, although the number of rows can be other than two (e.g., one or three or more). Each connector 52 and 54 is adapted to receive a corresponding connector from an electrical device. As such, each electrical device comprises a pair of corresponding connectors that enable the electrical device to connect electrically or optically to the primary backplane 50. When installed in the system in which the primary backplane 50 resides, the electrical devices generally protrude away from the primary backplane 50 at an orthogonal angle to the plane of the backplane.

FIG. 1 also illustrates a surface region 60 formed on the primary backplane. In accordance with various embodiments, the surface region 60 is substantially devoid of any components such as, for example, electronic components such as chips, connectors, or any component that would otherwise mechanically interfere with the installation of a secondary backplane in that surface region.

FIG. 1 also illustrates an example of a suitable registration mechanism in the form of registration holes 62. The registration holes 62 facilitate proper alignment of the secondary backplane during installation of the secondary backplane. The registration mechanism will be described in greater detail below.

Figure 2:
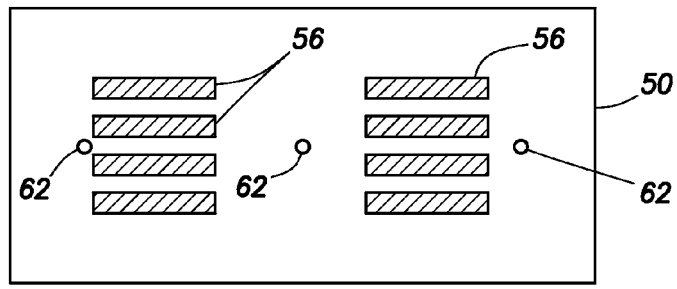
FIG. 2 shows a second surface of the primary backplane in accordance with various embodiments.

FIG. 2 illustrates a second (e.g., opposite) surface of the primary backplane 50. FIG. 2 shows the registration holes 62 as well as one or more connectors 56. Each connector 56 is used to electrically connect an electrical device, such as a switch module, to the primary backplane 50. Thus, the primary backplane 50 depicted in FIGS. 1 and 2 comprises two sides, each of which includes connectors for mating to electrical devices thereby permitting electrical devices to be mated to either side of the backplane 50. This configuration of electrical devices and the primary backplane 50 can be seen in FIG. 3.

Figure 3:
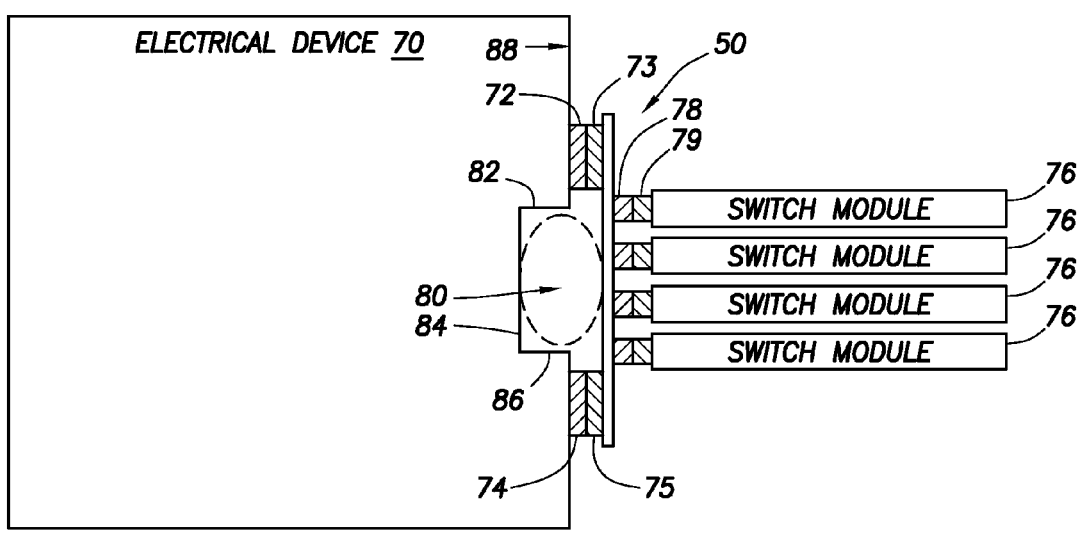
FIG. 3 shows a side view of electrical devices mated to the primary backplane in accordance with various embodiments.

FIG. 3 illustrates a side view of electrical devices 70 and 76 mated to connectors on the primary backplane 50. The electrical device 70 (e.g., a server) shown in FIG. 3 comprises connectors 72 and 74 mated to corresponding connectors 73 and 75 provided on the primary backplane. FIG. 3 also illustrates various other electrical devices 76 (e.g., switch modules in the example of FIG. 3) mated to an opposing side of the primary backplane 50. Each switch module 76 comprises a connector 79 that mates to a corresponding connector 78 provided on the primary backplane 50. As can be seen in the illustrative embodiment of FIG. 3, electrical devices 70 and 76 mate to opposing sides of the primary backplane 50.

In accordance with various embodiments, electrical device 70 comprises a "cut-out" area 80. In the embodiment of FIG. 3, the cut-out area is defined by edges 82, 84, and 86, where edge 84 is orthogonal to edges 82 and 86 and parallel to the edge 88 of the electrical device 70. Thus, the illustrative cut-out area 80 in FIG. 3 is generally square or rectangular in shape. When the electrical device 70 is mated to the primary backplane 50, the cut-out area 80 corresponds to the surface region 60 of the primary backplane which, as described above, is generally devoid of any components that would interfere with the installation of a secondary backplane.

Figure 4:
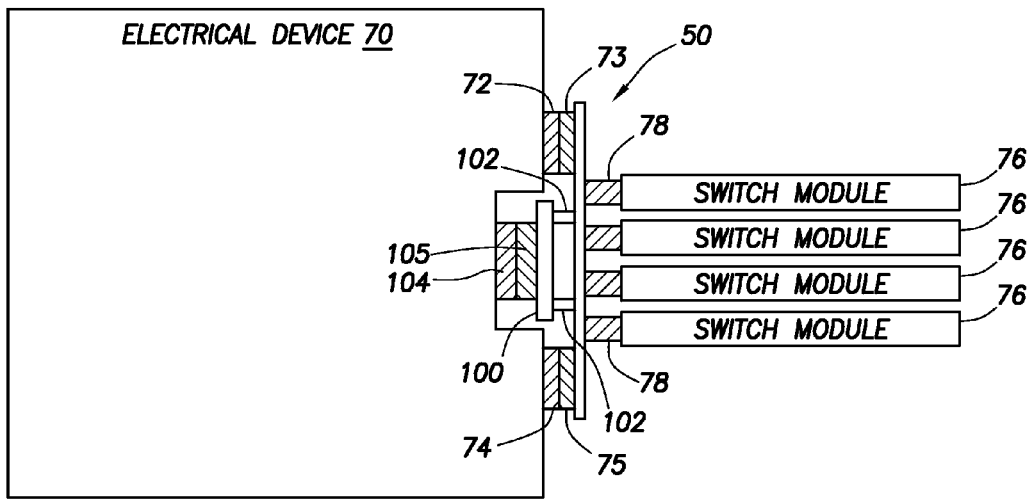
FIG. 4 shows a side view of electrical devices mated to primary and secondary backplanes in accordance with various embodiments.

FIG. 4 illustrates a side view of the electrical device 70 mated to the primary backplane 50 and also to a secondary backplane 100. As noted above, the term "secondary" should not be construed to impart any functional limitations on the nature of the backplane 100. The term "secondary" is used merely to distinguish the backplanes 50 and 100 from each other.

The secondary backplane 100 of FIG. 4 comprises a PCB having two or more connectors that mate to corresponding connectors provided on the electrical device 70 in the cut-out area 80. FIG. 4 shows the secondary backplane having a connector 105 mated to a corresponding connector 104 provided on the electrical device 70. In accordance with at least some embodiments, the secondary backplane 100 mates to the primary backplane 50 via only a mechanical mechanism (e.g., standoffs 102). In some embodiments there is no electrical connectivity between the backplanes 50 and 100, although in other embodiments, electrical connectivity between backplanes may be provided.

In the example of FIG. 4, the electrical device 70 mates to two backplanes—primary backplane 50 and secondary backplane 100—via multiple connectors 72, 74 and 104. In accordance with various embodiments, the primary backplane 50 functions to interconnect the switch modules 76 to the various electrical devices 70.

Figure 5:
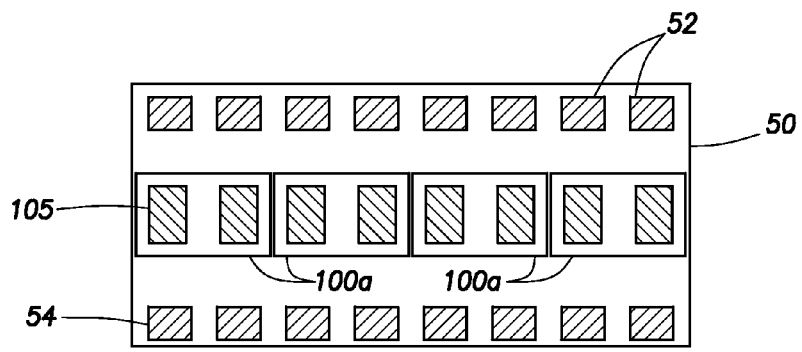
FIG. 5 shows an example of secondary backplanes each adapted to accept two electrical devices in accordance with various embodiments.
Figure 6:
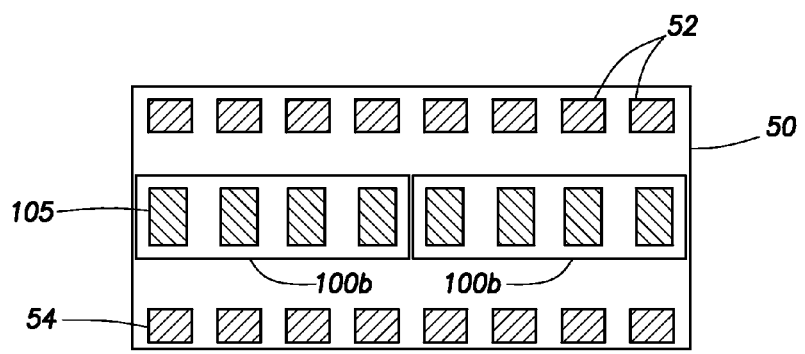
FIG. 6 shows an example of secondary backplanes each adapted to accept four electrical devices in accordance with various embodiments.
Figure 7:
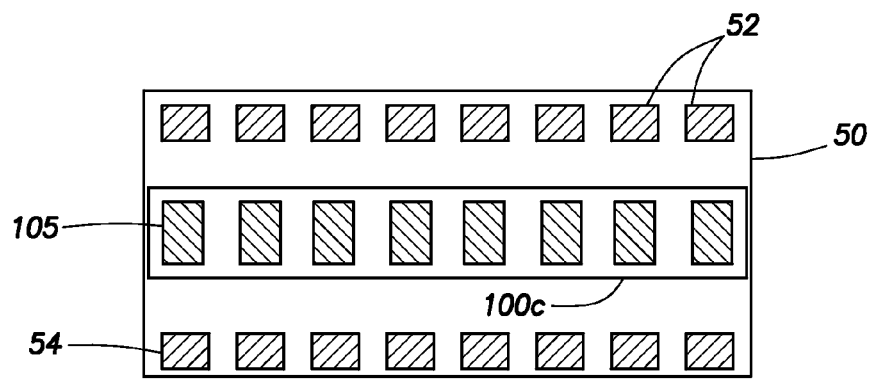
FIG. 7 shows an example of secondary backplanes each adapted to accept eight electrical devices in accordance with various embodiments.

The secondary backplane 100 communicatively interconnects (e.g., electrical interconnection, optical interconnection) only those electrical devices 70 that connect to the secondary backplane 100. FIGS. 5-7 illustrate various examples of secondary backplanes 100. In FIG. 5, the secondary backplanes 100 are designated by reference numeral 100a. Each secondary backplane 100a in the example of FIG. 5 electrically or optically interconnects two electrical devices. FIG. 5 shows an example in which eight electrical devices 70 can be mated to the primary backplane 50. Accordingly, four secondary backplanes 100a are provided to interconnect adjacent pairs of electrical devices.

In FIG. 6, the secondary backplanes 100 are designated by reference numeral 100b. Each secondary backplane 100b in the example of FIG. 6 communicatively interconnects four electrical devices. Because eight electrical devices 70 can be mated to the primary backplane 50, two secondary backplanes 100b are provided to interconnect four adjacent electrical devices.

In FIG. 7, the secondary backplanes 100 are designated by reference numeral 100c. Each secondary backplane 100c in the example of FIG. 7 can interconnect eight electrical devices 70. Because eight electrical devices 70 can be mated to the primary backplane 50, the secondary backplane 100c is adapted to interconnect all eight electrical devices 70. Of course, the secondary backplane 100 can be configured to interconnect any number of electrical devices 70.

The secondary backplane 100 is useful for a variety of purposes. For instance, some systems may implement a non-uniform memory access (NUMA) system in which processors and memory devices are electrically connected together. Such interconnections typically require a very large number of signals. The primary backplane 50 is used to electrically or optically connect the switch modules 76 on one side of the primary backplane 50 to the electrical devices 70 on the other side of the primary backplane. Adding to the primary backplane 50 a large number of inter-processor connections would greatly complicate the design and construction of the primary backplane, and may make the primary backplane uneconomical. The secondary backplane 100 thus is used to provide such inter-processor connections. Different backplanes 100, having different trace routing layouts, can be used to interconnect electrical devices 70 in varying ways.

As described herein, the secondary backplane 100 interconnects adjacent groups of electrical devices. The term "adjacent" includes adjacent slots in a chassis in which blade devices are installed. The term "adjacent" not only refers to two neighboring electrical devices, but also to more than two neighboring electrical devices. For example, four consecutively located electrical devices where each such electrical device is adjacent at least one other adjacent electrical device are considered as a group to be "adjacent."

Figure 8:
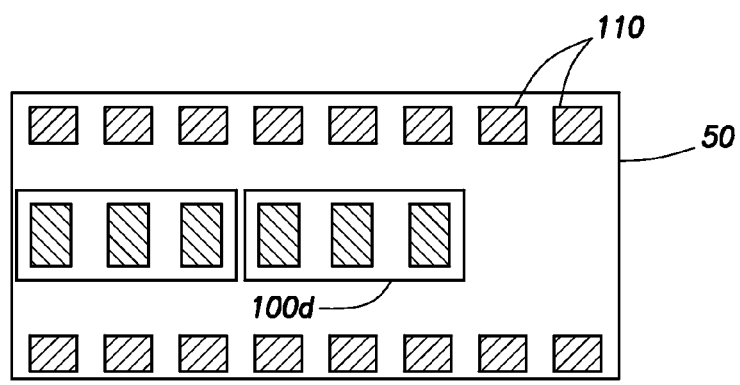
FIG. 8 shows an example in which secondary backplanes can be used for some slots in the system, but not all slots, in accordance with various embodiments.

FIG. 8 shows an embodiment in which two secondary backplanes 100d are provided. Each secondary backplane 100d interconnects up to three electrical devices 70. With a primary backplane 50 that can accommodate up to eight electrical devices 70, two slots 100 remain in which electrical devices 70 can be installed without being connected to a secondary backplane. Thus, FIG. 8 illustrates a system having some electrical devices 70 being interconnected by way of primary and secondary backplanes, while other electrical devices 70 connect to the primary backplane 50 only and not to a secondary backplane 100.

FIG. 8 illustrates the flexibility of the system. On one hand, the system can include secondary backplanes 100 that interconnect electrical devices 70 that have the cut-out area 80 and associated connector 104 to provide additional connectivity between adjacent electrical devices 70 besides the connectivity provided by the primary backplane 50. On the other hand, the system can also accommodate electrical devices 70 that do not have the cut-out area 80 and associated connector 104. Moreover, a secondary backplane 100 of any size (in terms of number of electrical devices 70 that can be interconnected via the secondary backplane) can be mated to the primary backplane 50.

Figure 9:
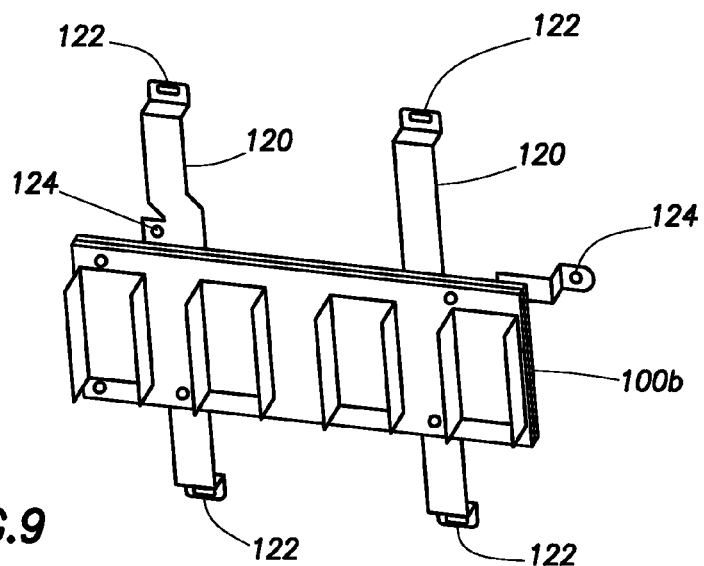
FIG. 9 shows an embodiment of a secondary backplane and the mechanism by which the secondary backplane mechanically mates to the primary backplane in accordance with various embodiments.

FIG. 9 illustrates an embodiment of a four connector, secondary backplane 100b. In the example of FIG. 9, a pair of brackets 120 are provided that can be mated (e.g., by way of screw, rivet, etc.) to the primary backplane, thereby mechanically securing the secondary backplane 100b to the primary backplane 50. In the example of FIG. 9, six mechanical connection points are provided. Four of the connection points are provided as holes 122 on the brackets 120. Two additional connection points 124 are also provided as shown. To attach the secondary backplane 100b to the primary backplane 50, the holes 124 are aligned with the registration holes 62 on the primary backplane (FIG. 1). Once aligned, a screw or other securing device is inserted through holes 122 and 62. Thereafter, screws or other securing devices can be inserted into holes 122 to secure the brackets 120 in place on the primary backplane 50. Holes 122 are generally large enough to permit enough "play" in the orientation of the secondary backplane 100 to properly align holes 124 and 62. The holes 124 and 62 comprise a registration mechanism that properly orients the primary and secondary backplanes 50, 100 to ensure that the connectors on the two backplanes align properly so that an electrically device can be readily mated (e.g., blind-mated) to both backplanes. Once the secondary backplane 100 is mated to the primary backplane 50, electrical devices 70 can be mated to the primary and secondary backplanes as described above.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
    a primary backplane having a surface region substantially devoid of components, and a plurality of connectors to which electrical devices can be mated; and
    a secondary backplane removably mated to said primary backplane within said region, said secondary backplane having at least two connectors adapted to mate to at least two of said electrical devices, said at least two electrical devices communicatively interconnect through said primary and secondary backplanes;
    wherein the region is between at least two of the plurality of connectors on the primary backplane.

2. The system of claim 1 further comprising a bracket that mates said secondary backplane to said primary backplane, said bracket attaching to said primary backplane via a registration mechanism that causes at least one of the connectors on the primary backplane and at least one of the connectors on the secondary backplane to align with corresponding connectors on at least one the electrical device.

3. The system of claim 1 further wherein at least one of said electrical devices can be mated to a connector on said primary backplane but not to the secondary backplane.

4. The system of claim 1 wherein at least one electrical device comprises an edge that defines a cut-out region that corresponds to said region, said secondary backplane electrically couples to said at least one electrical device within said cut-out region.

5. The system of claim 1 wherein the region is between at least two groups of said primary backplane's connectors.

6. The system of claim 1 wherein each removable electrical device mates to said primary backplane via a pair of connectors on said primary backplane and said region resides between said pair of connectors.

7. The system of claim 1 wherein said removable electrical devices comprise blade devices.

8. The system of claim 1 wherein said removable electrical devices comprise devices selected from a group consisting of servers, input/output devices, volatile memory devices, non-volatile storage devices and switches.

9. The system of claim 1 wherein said region is on a side of the primary backplane that has said at least two of the plurality of connectors on the primary backplane.

10. The system of claim 1 further comprising a plurality of secondary backplanes that removably mate to said primary backplane.

11. The system of claim 10 wherein each secondary backplane communicatively interconnects at least two electrical devices mated thereto.

12. A system, comprising:
    a plurality of electrical devices;
    a primary backplane having a surface region substantially devoid of components, and a plurality of connectors to which said electronic devices can be mated and communicatively interconnected via said primary backplane, said region being between at least two of the plurality of connectors on the primary backplane; and
    a secondary backplane mechanically mated to said primary backplane within said region, said secondary backplane having at least two connectors adapted to mate to at least two of said electronic devices;
    wherein said electrical devices that mate to said secondary backplane communicatively interconnect independently through said primary and secondary backplanes.

13. The system of claim 12 wherein said system comprises a plurality of secondary backplanes mechanically mated to said primary backplane.

14. The system of claim 12 wherein said system comprises a plurality of secondary backplanes mechanically mated to said primary backplane, wherein each secondary backplane is adapted to communicatively interconnect a group of adjacent electrical devices that is separate from a group of adjacent electrical devices communicatively interconnected by another secondary backplane.

15. The system of claim 12 wherein said secondary backplane communicatively interconnects adjacent electrical devices.

16. The system of claim 12 wherein said electronic devices comprise devices selected from a group consisting of servers, input/output devices, volatile memory devices, non-volatile storage devices and switches.

17. The system of claim 12 further comprising at least one electrical device that mates to said primary backplane but not to a secondary backplane.

18. A method of electrically interconnecting removable electronic devices in a system, comprising:
    attaching a secondary backplane to a primary backplane; and
    installing a first removable electronic device in a slot in said system to thereby mate at least two connectors on said first electronic device to corresponding connectors on said primary backplane and to mate to a third connector on said first electronic device to a corresponding connector on said secondary backplane;
    wherein electrical or optical connectivity is provided from said slot through said primary and second backplanes to at least one other slot.

19. The method of claim 18 wherein attaching the secondary backplane comprising engaging a registration mechanism provided on said primary backplane.

20. The method of claim 18 further comprising installing a second removable electronic device in a slot in said system to thereby mate connectors on said second electronic device to corresponding connectors on said primary and second backplanes, wherein said first and second removable electronic devices are electrically interconnected via said primary and secondary backplanes.

21. The method of claim 18 further comprising installing a second removable electronic device in a slot in said system to thereby mate at least one connector on said second electronic device to at least one corresponding connector on said primary backplane, wherein said first and second removable electronic devices are electrically or optically interconnected via said primary backplane, but not said secondary backplane.

* * * * *

UNITED STATES PATENT AND TRADEMARK OFFICE
CERTIFICATE OF CORRECTION

| | | |
|---|---|---|
| PATENT NO. | : 7,780,455 B2 | Page 1 of 1 |
| APPLICATION NO. | : 11/669860 | |
| DATED | : August 24, 2010 | |
| INVENTOR(S) | : Kevin B. Leigh et al. | |

It is certified that error appears in the above-identified patent and that said Letters Patent is hereby corrected as shown below:

In column 6, line 46, in Claim 18, delete "second" and insert -- secondary --, therefor.

In column 6, line 54, in Claim 20, delete "second" and insert -- secondary --, therefor.

Signed and Sealed this
Eighth Day of March, 2011

David J. Kappos
*Director of the United States Patent and Trademark Office*